United States Patent
Fujisaki

(10) Patent No.: US 7,278,466 B2
(45) Date of Patent: Oct. 9, 2007

(54) SEMICONDUCTOR DEVICE COOLING APPARATUS

(75) Inventor: Akihiko Fujisaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 78 days.

(21) Appl. No.: 11/000,897

(22) Filed: Dec. 2, 2004

(65) Prior Publication Data
US 2006/0032611 A1    Feb. 16, 2006

(30) Foreign Application Priority Data
Aug. 13, 2004    (JP) .............................. 2004-235736

(51) Int. Cl.
*H05K 7/20* (2006.01)

(52) U.S. Cl. .................... 165/80.4; 165/170; 257/714; 361/699

(58) Field of Classification Search ............... 165/80.4, 165/170, 908; 257/714; 361/698, 699
See application file for complete search history.

(56) References Cited

U.S. PATENT DOCUMENTS

| | | | | | |
|---|---|---|---|---|---|
| 3,882,934 | A | * | 5/1975 | Knoos et al. ............... | 165/170 |
| 3,909,118 | A | * | 9/1975 | Schmidt ..................... | 165/908 |
| 3,923,383 | A | * | 12/1975 | Engel et al. ................. | 165/170 |
| 4,260,015 | A | * | 4/1981 | Tamburini ................... | 165/170 |
| 4,411,311 | A | * | 10/1983 | Touze .......................... | 165/170 |
| 4,450,896 | A | * | 5/1984 | Opitz et al. ................. | 165/80.4 |
| 4,489,570 | A | * | 12/1984 | Little .......................... | 165/168 |
| 4,909,315 | A | * | 3/1990 | Nelson et al. .............. | 165/908 |
| 5,056,127 | A | * | 10/1991 | Iversen et al. ............. | 165/80.4 |
| 5,761,037 | A | * | 6/1998 | Anderson et al. .......... | 165/80.4 |
| 6,014,312 | A | * | 1/2000 | Schulz-Harder et al. .... | 361/699 |
| 6,796,370 | B1 | * | 9/2004 | Doll ........................... | 165/80.4 |

FOREIGN PATENT DOCUMENTS

JP    10-246531    9/1998

* cited by examiner

*Primary Examiner*—Leonard R. Leo
(74) *Attorney, Agent, or Firm*—Arent Fox LLP

(57) ABSTRACT

In a semiconductor device cooling apparatus which cools a semiconductor device uniformly with a simple structure, a coolant is supplied from a supply port to the center of a heat transmission plate on which a semiconductor device is disposed in intimate contact therewith, is radially flown toward the peripheral edge portion of the heat transmission plate through a gap-shaped flow path which is formed by a gap forming plate composed of two thin plate members of a gap interval plate acting as a spacer and a gap top plate disposed on the gap interval plate and has a small height, is collected by a collection groove formed around the peripheral edge portion, and is discharged from a discharge port.

2 Claims, 8 Drawing Sheets

"Prior Art"

"Prior Art"

"Prior Art"

"Prior Art"

SEMICONDUCTOR DEVICE COOLING APPARATUS

BACKGROUND OF THE INVENTION

1. Field of the Invention

The present invention relates to a semiconductor device cooling apparatus used to cool a semiconductor device with a liquid.

2. Description of the Related Art

Heretofore, various types of structural parts for cooling semiconductor devices are proposed, and, in particular, various groove type and tube type coolant flow path structures are conventionally used often to a semiconductor device cooling apparatus called a cooling plate that is used to cool a semiconductor device by a fluid.

FIGS. 1(A) and 1(B) are views showing a schematic structure of a cooling plate having groove type flow paths, wherein FIG. 1(A) is a sectional plan view of the cooling plate taken along the arrow-carrying line X—X of the cooling plate shown in FIG. 1(B), and FIG. 1(B) is a side view of the cooling plate.

The cooling plate 20 includes a heat transmission plate 21, a semiconductor device 10 is joined to an outer surface 21a of the heat transmission plate 21 through a joint member 11, and the flow paths described below are formed along an inner surface 21b of the heat transmission plate 21. That is, a coolant (here, water is used as an example of the coolant) is supplied from a coolant supply port 22, and water as the coolant flows on the inner surface 21b of the heat transmission plate 21 through groove type flow paths 24a formed between standing fins 23a, further flows on the inner surface 21b of the heat transmission plate 21 passing through groove type flow paths 24b formed between standing fins 23b, and is discharged from a coolant discharge port 25.

The cooling plate 20 having the groove type flow paths 24a and 24b is disadvantageous in that the structure of it is complex and a manufacturing cost is expensive, although a high cooling performance can be easily obtained when the semiconductor device 10 is cooled thereby.

FIGS. 2(A) and 2(B) are schematic configurational views of a cooling plate having a tube type flow path, wherein FIG. 2(A) is a plan view of the cooling plate, and FIG. 2(B) is a side view of the cooling plate.

The cooling plate 30 shown in FIGS. 2(A) and 2(B) has a somewhat thick heat transmission plate 31, and a semiconductor device 10 is joined to an outer surface 31a of the heat transmission plate 31 through a joint member 11.

Further, a tube type flow path 32 is formed in the heat transmission plate 31. A coolant (for example, water) supplied from a coolant supply port 33 passes through the tube type flow path 32, receives heat transmitted thereto through the heat transmission plate 31 while it passes through the flow path 32, and is discharged from a coolant discharge port 34.

While the cooling plate having the tube type flow path as shown in FIGS. 2(A) and 2(B) can be made at a relatively low cost, the cooling plate is disadvantageous in that it has a low cooling capability and it is difficult to reduce its size.

Further, although illustration is omitted, Japanese Patent Application Laid-Open Publication (JP-A) No. 10-246531 discloses a cooling structure arranged such that a semiconductor device 10 is joined to an outer surface 21a of a heat transmission plate 21 as shown in, for example, FIG. 1, and laminar flow paths are formed along an inner surface of the heat transmission plate 21 so that a coolant flows in one direction, for example, from right to left in the figure in parallel with the inner surface of the heat transmission plate 21.

In the flow path structure of JP-A 10-246531, since the laminar flow paths are formed along the inner surface of the heat transmission plate, a heat absorption performance higher than that of the flow path structure shown in FIGS. 2(A) and 2(B) can be obtained. However, since the coolant flows in the one direction, for example, from right to left, it has a temperature gradient between the right side and the left side thereof, from which a problem arises in that the coolant has a different heat absorption capability on the right side and the left side of a semiconductor device and it is difficult to uniformly cool the semiconductor device by the flow path structure.

SUMMARY OF THE INVENTION

The present invention has been made in view of the above circumstances and provides a semiconductor device cooling apparatus that can uniformly cool a semiconductor device excellently by a simple structure.

In the semiconductor device cooling apparatus of the present invention that includes a heat transmission plate which receives heat from a semiconductor device at approximately the center of an outer surface and forms a coolant flow path in contact with the inner surface of the heat transmission plate opposite to the outer surface thereof facing the semiconductor device, the semiconductor device cooling apparatus further includes: a coolant supply port that supplies a coolant to the central portion of the inner surface of the heat transmission plate; a gap-shaped flow path sandwiched between the inner surface of the heat transmission plate and a surface that extends in parallel with the inner surface, the gap-shaped flow path radially flowing out the coolant supplied to the central portion of the inner surface of the heat transmission plate from the central portion toward the peripheral edge portion of the inner surface of the heat transmission plate; a coolant collection groove which is formed around the peripheral edge portion and whose height from the inner surface of the heat transmission plate is larger than the height of the gap-shaped flow path to collect the coolant flowing out from the gap-shaped flow path; and a coolant discharge port for discharging the coolant collected in the coolant collection groove therefrom.

In the semiconductor device cooling apparatus of the present invention, since a thin laminar flow of coolant (water) is formed along the inner surface of the heat transmission plate by forming the gap-shaped flow path having the small height, a high heat absorption capability can be obtained by a relatively simple structure. Further, the gap-shaped flow path is a flow path that allows a coolant supplied to the central portion of the inner surface of the heat transmission plate to radially flow from central portion of the heat transmission plate toward the peripheral edge portion thereof so that the semiconductor device can be uniformly cooled.

In the semiconductor device cooling apparatus of the present invention, it is preferable that the apparatus includes: a gap forming plate disposed partly in contact with the inner surface of the heat transmission plate to form the gap-shaped flow path between the surface extending in parallel with the inner surface and the inner surface; an elastic member which presses the gap forming plate against the inner surface of the heat transmission plate as well as whose side acts as a side wall for partitioning the coolant collection groove; and a housing that keeps the elastic member in the state that the elastic member presses the gap forming plate as well as partitions the coolant collection groove in cooperation with the outer peripheral portion of the inner surface of the heat transmission plate and a side of the elastic member. In this case, it is preferable that the gap forming plate be composed of a gap top plate, which has a surface expanding in parallel with the inner surface of the heat transmission plate and forms the gap-shaped flow path in cooperation with the inner surface of the heat transmission plate, and a gap interval plate which is interposed between the gap top plate and the inner surface of the heat transmission plate and keeps the gap top plate at a height position where the gap-shaped flow path is formed.

The gap-shaped flow path can be simply, easily and accurately formed at a low cost by the combination of the gap forming plate and the elastic member.

As described above, according to the present invention, a semiconductor device can be uniformly and excellently cooled by the relatively simple structure.

DETAILED DESCRIPTION OF THE INVENTION

Embodiments of the present invention will be explained below.

Figure 3:
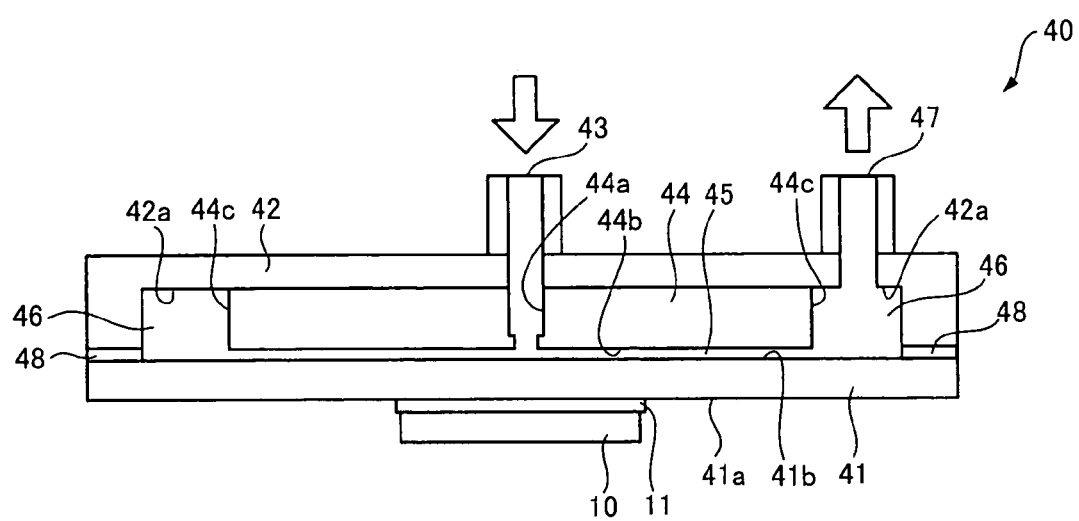
FIG. 3 is a longitudinal sectional view of a cooling plate as a first embodiment of a semiconductor device cooling apparatus of the present invention.
Figure 4:
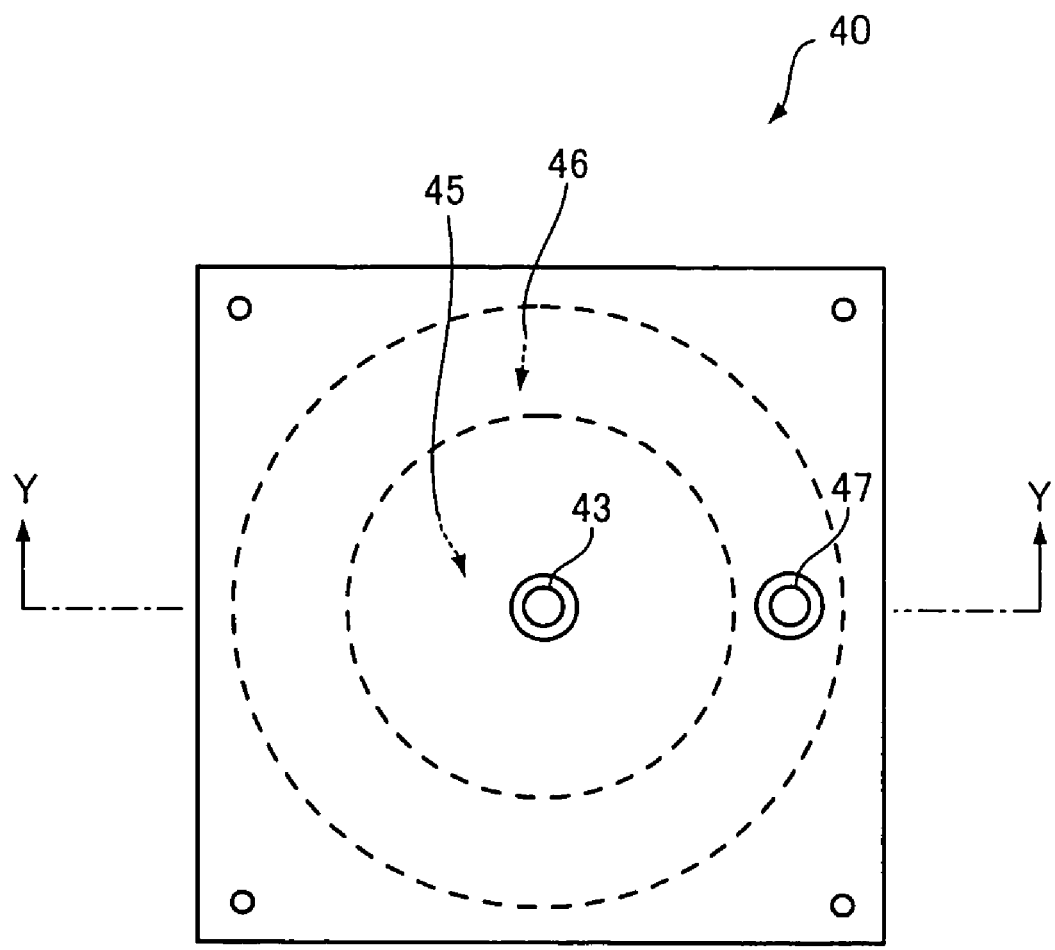
FIG. 4 is a plan view of the cooling plate of the first embodiment.

FIG. 3 is a longitudinal sectional view showing a cooling plate as a first embodiment of a semiconductor device cooling apparatus of the present invention, and FIG. 4 is a plan view of the cooling plate of the first embodiment. FIG. 3 is a sectional view of the cooling plate taken along the arrow-carrying line Y—Y of FIG. 4. Note that the sectional view of the cooling plate in FIG. 3 is larger than the plan view of it in FIG. 4 for the easy comprehension of it.

The cooling plate 40 shown in FIGS. 3 and 4 is provided with a heat transmission plate 41 having an outer surface 41a on which a semiconductor device 10 is closely fixed with a thermal joint member 11 such as a solder, an adhesive, a thermal grease, a thermal sheet, and the like.

Further, a housing 42 has an annular projection 44 having a hole 44a defined at a center, and the hole 44a is connected to a supply port 43. The annular projection 44 has a surface 44b facing the heat transmission plate 41, and the surface 44b extends in parallel with an inner surface 41b of the heat transmission plate 41 with a predetermined gap therebetween, and a thinly extending gap-shaped flow path 45 is formed by the inner surface 41b of the heat transmission plate 41 and a surface 44b of the annular projection 44.

The annular projection 44 may be a portion of the housing 42 formed integrally with the housing 42 or may be formed independently of the housing 42 and joined to the housing 42.

Water (coolant) supplied from the supply port 43 is supplied to a central portion of the inner surface 41b of the heat transmission plate 41 and passes through the gap-shaped flow path 45 to thereby extend radially from the central portion of the heat transmission plate 41 toward a peripheral edge portion thereof along the inner surface 41b of the heat transmission plate 41.

Further, the peripheral edge portion of the heat transmission plate 41 has a collection groove 46 formed therearound which collects water flowing out from the gap-shaped flow path 45. The collection groove 46 is partitioned by the inner surface 41b of the heat transmission plate 41, a side surface 44c of the annular projection 44, and an inner surface 42a of the housing 42. The height of the collection groove 46 from the inner surface 41b of the heat transmission plate 41 is larger than that of the gap-shaped flow path 45. Accordingly, the water supplied from the supply port 43 and flowing radially through the gap-shaped flow path 45 flows out from the gap-shaped flow path 45 and flows into the collection groove 46. Further, a discharge port 47 is formed to communicate with the collection groove 46, and the water flown into the collection groove 46 is discharged to the outside from the discharge port 47. The heat transmission plate 41 is joined to the housing 42 in the outermost peripheral portions thereof outside the collection groove 46 by an adhesive and the like to thereby form a joint section 48 so that the water supplied from the supply port 43 does not leak from any portions other than the discharge port 47.

Here, a material having a high heat transmission property such as copper and the like is used as a material of the heat transmission plate 41. Further, the housing 42 and the annular projection 44 are preferably formed of a low heat transmission material such as a resin, SUS (stainless steel), and the like. When the resin is used, a mass production method such molding and the like for integrally molding the housing 42 and the annular projection 44 can be used. Further, although the size of the interval of the gap-shaped flow path 45 (the interval between the inner surface 41b of the heat transmission plate 41 and the surface 44b of the annular projection 44 on the heat transmission plate side thereof) is set according to a necessary cooling capability, it is preferable to ordinarily set the size to 0.5 mm or less. Further, the size is preferably set to about 0.1 mm for cooling of about 100 W.

Figure 1A:
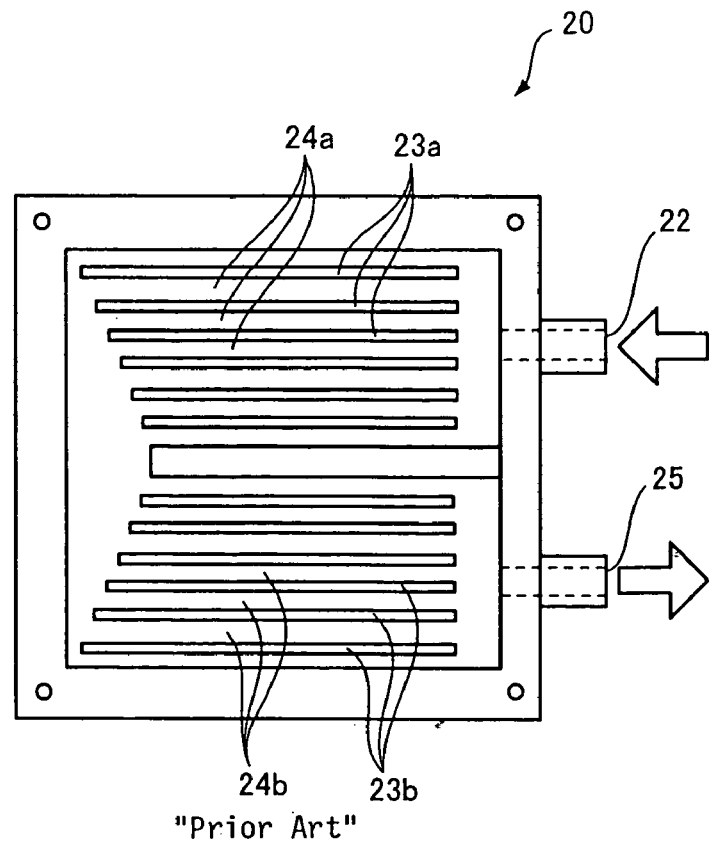
FIGS. 1(A) and 1(B) are views showing a schematic structure of a cooling plate having groove type flow paths.
Figure 1B:
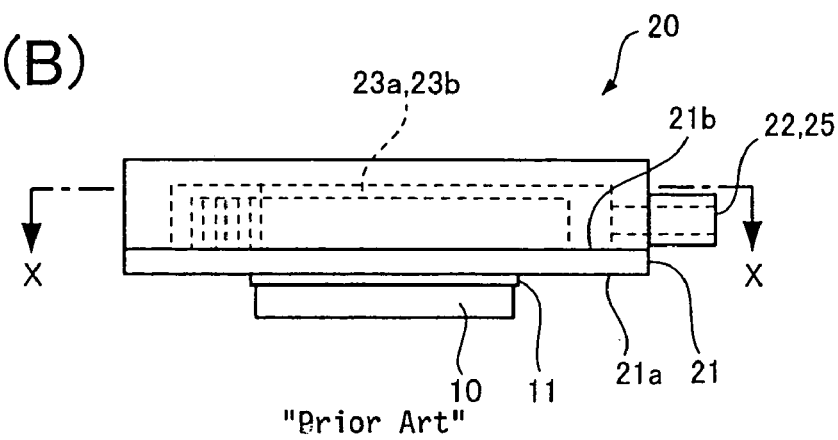
Figure 2A:
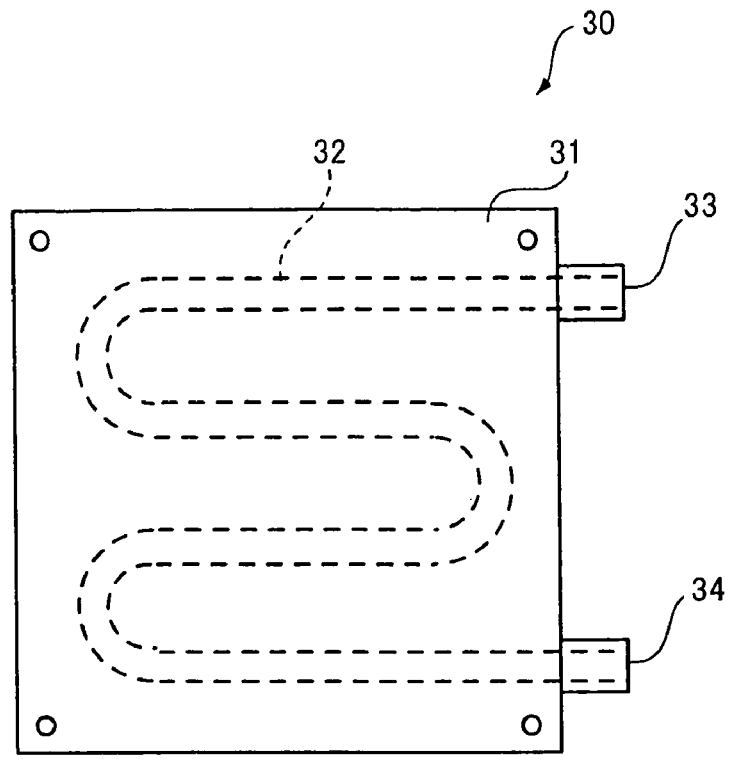
FIGS. 2(A) and 2(B) are schematic configurational views of a cooling plate having a tube type flow path.
Figure 2B:
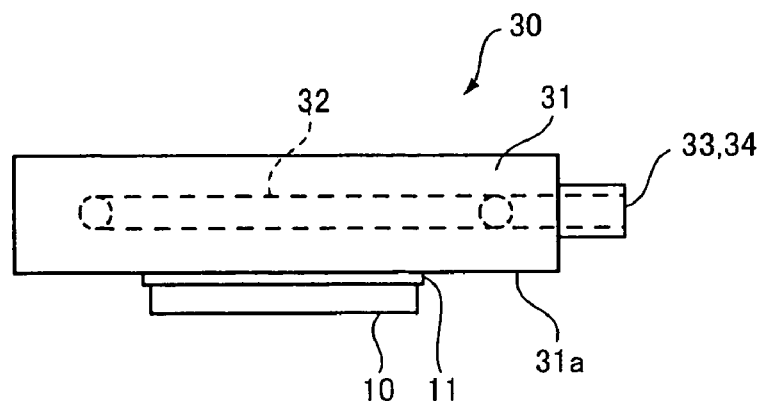

The cooling plate of the conventional example shown in FIG. 1 has a complex structure because it has a lot of the standing fins 23a and 23b. In the cooling plate of the first embodiment shown in FIGS. 3 and 4, however, leading components are only the annular projection 44 that forms the gap-shaped flow path 45 in addition to the heat transmission plate 41 and the housing 42 formed in the simple shape with the void in the inside thereof, and the annular projection 44 can be formed integrally with the housing 42 by the resin molding method and the like as the same part. Accordingly, the cooling plate of the first embodiment is simple in structure and can be manufactured at a low cost.

Although the cooling capability of the cooling plate of the first embodiment will be explained in detail later, it can cool the entire surface of the semiconductor device 10 approximately uniformly.

Figure 5:
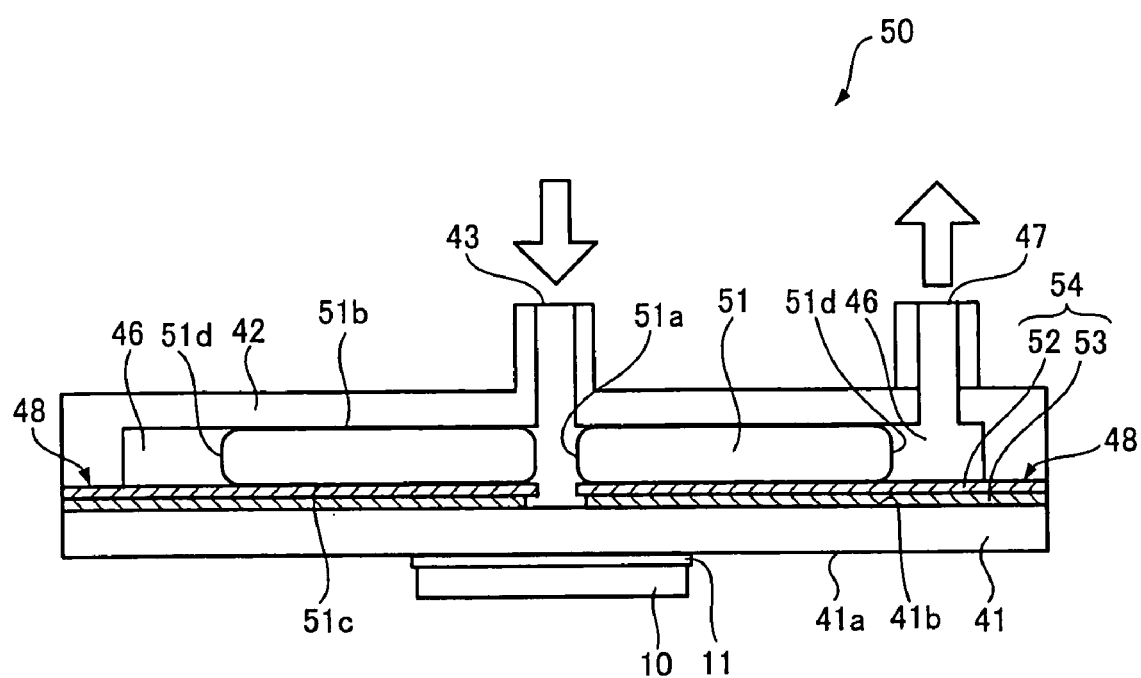
FIG. 5 is a longitudinal sectional view showing a cooling plate as a second embodiment of the semiconductor device cooling apparatus of the present invention.

FIG. 5 is a longitudinal sectional view showing a cooling plate of a second embodiment of the semiconductor device cooling apparatus of the present invention. Since the outside shape of the semiconductor device cooling apparatus of the second embodiment is the same as that of the semiconductor device cooling apparatus of the first embodiment described above, FIG. 4 showing the outside shape of the semiconductor device cooling apparatus of the first embodiment will be referred to here as it is as a view showing the outside shape of the semiconductor device cooling apparatus of the second embodiment. FIG. 5 is a sectional view of the cooling plate taken along the arrow-carrying line Y—Y of FIG. 4 supposing that FIG. 4 is a plan view showing of the outside shape of the semiconductor device cooling apparatus of the second embodiment.

Further, the components in FIG. 5, which correspond to those of the semiconductor device cooling apparatus of the first embodiment shown in FIGS. 3 and 4, are denoted by the same reference numerals as those used in FIGS. 3 and 4, and the difference between the semiconductor device cooling apparatus of the first embodiment explained with reference to FIGS. 3 and 4 and that of the second embodiment will be explained.

The cooling plate 50 of the second embodiment shown in FIG. 5 is provided with an annular elastic member 51 and a gap forming plate 54 in place of the annular projection 44 in the cooling plate 40 of the first embodiment shown in FIG. 3, the gap forming plate 54 being composed of two thin plate members of a gap top plate 52 and a gap interval plate 53.

The annular elastic member 51, which has a hole 51a formed at a center and communicating with a supply port 43, is composed of a material such as a plate-shaped rubber and the like and made at a low cost by a mass-production method such as press (stamping) and the like. The annular elastic member 51 has such a role that its upper surface 51b is pressed by a housing 42 and its lower surface 51c presses the gap forming plate 54 against a heat transmission plate 41 side. Further, an outer peripheral side 51d of the annular elastic member 51 acts as a side wall for partitioning a collection groove 46.

Further, the elastic member 51 may be appropriately provided with void-like wall-thickness-reduced portions such as holes, grooves, and the like within a range in which the central hole 51a does not communicate with the side 51d. With this arrangement, the magnitude and the distribution of a load with which the elastic member 51 presses the gap forming plate 54 can be arbitrarily adjusted.

Further, the outermost peripheral portions of the heat transmission plate 41 and the housing 42 are entirely joined to each other together with the gap forming plate 54 with the gap forming plate 54 (gap top plate 52 and the gap interval plate 53) sandwiched therebetween, thereby a joint section 48 is formed to prevent a leakage.

Figure 6:
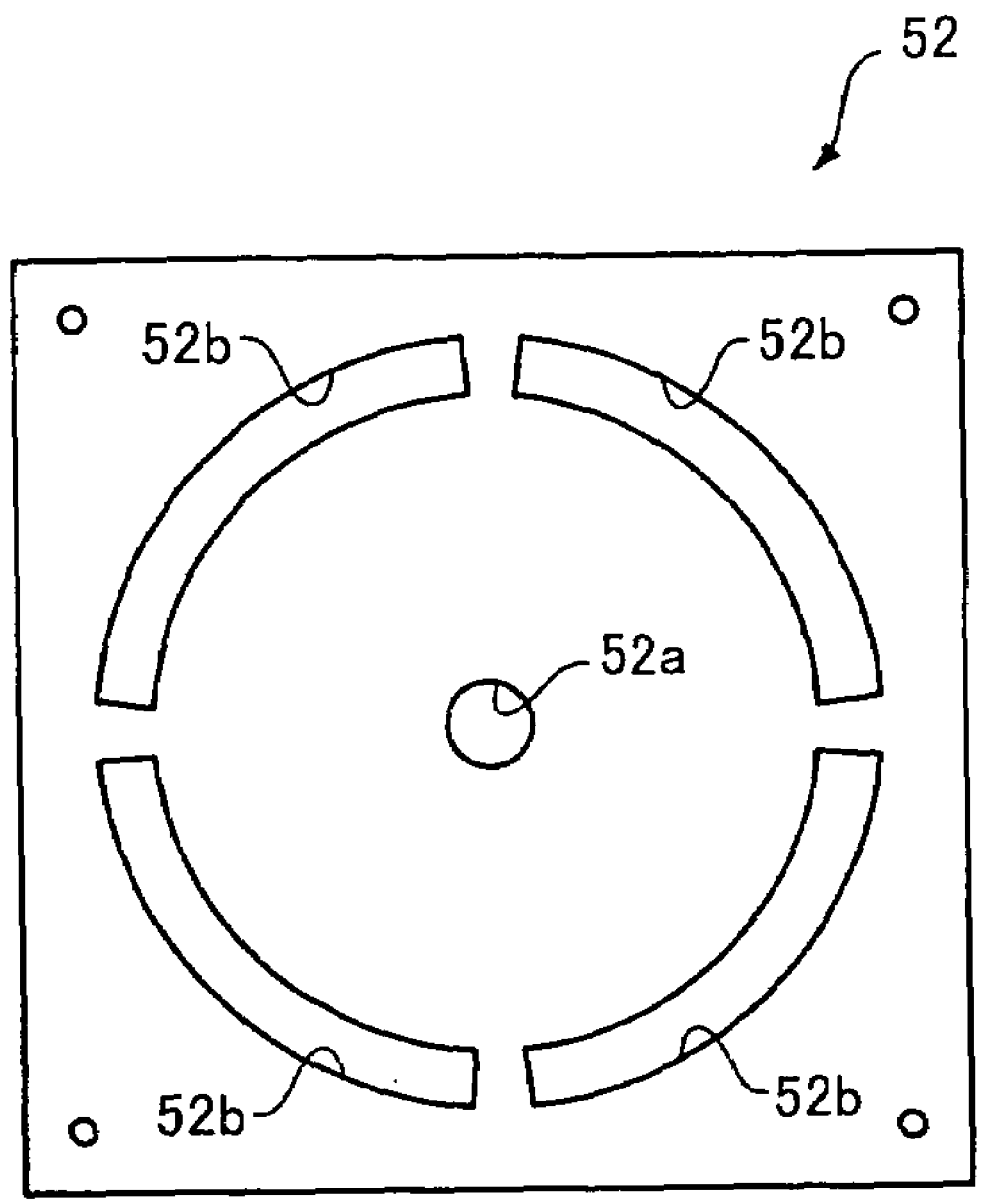
FIG. 6 is a plan view of a gap top plate.

FIG. 6 is a plan view of the gap top plate.

The gap top plate 52 has a hole 52a at a center communicating with the supply port 43 (refer to FIG. 5) as well as has a peripheral edge portion around which slits 52b divided into four parts are formed. A reason why these slits 52b are divided from each other is that if the entire peripheries of them are connected to each other, the gap top plate 52 cannot be established as one component. These four slits 52b are connected to the collection groove 46 shown in FIG. 5.

The gap top plate 52 is made of a thin plate member having a uniform thickness of a metal (for example, copper, stainless steel, and the like) and a resin at a low cost by a mass production method of press (stamping), etching, and the like.

Figure 7:
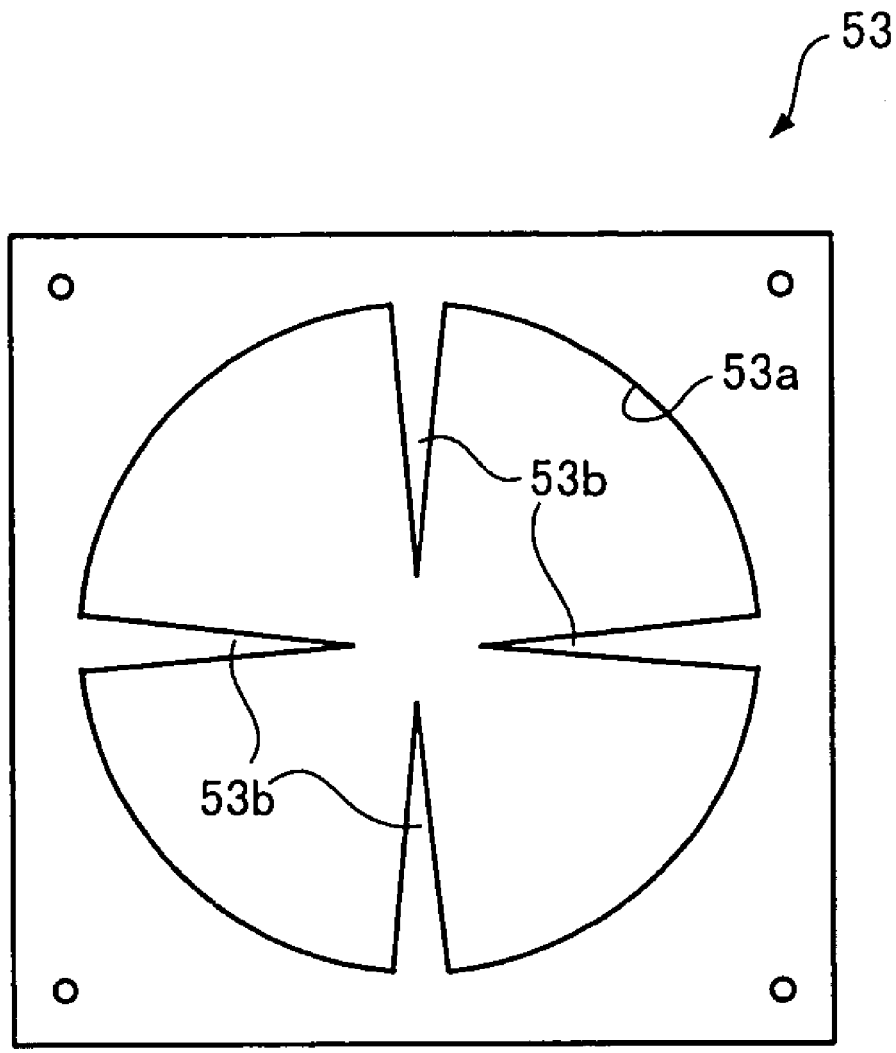
FIG. 7 is a plan view of a gap interval plate.

FIG. 7 is a plan view of the gap interval plate.

The gap interval plate 53 has an opening 53a formed thereto which extends in a circular shape in its entirety, and four projections 53b extend from the outer periphery of the opening 53a toward a center. The opening 53a dimensionally extends to the position where it communicates with the four slits 52b of the gap top plate 52 shown in FIG. 6. The four projections 53b extending inwardly of the opening 53a support the gap top plate 52 shown in FIG. 6 which is disposed on the gap interval plate 53. The gap interval plate 53 is also made of a thin plate member having a uniform thickness of a metal (for example, copper, stainless steel, and the like) and a resin at a low cost by the mass production method of press (stamping), etching, and the like likewise the gap top plate 52.

Explanation will be continued returning to FIG. 5.

In the cooling plate 50 shown in FIG. 5, the gap interval plate 53 having the shape shown in FIG. 7 is disposed on an inner surface 41b of the heat transmission plate 41, the gap top plate 52 having the shape shown in FIG. 6 is disposed on the gap interval plate 53, and the gap top plate 52 is pressed by the annular elastic member 51. When water is supplied from the supply port 43, it passes through the hole 51a at the center of the annular elastic member 51, passes through the hole 52a at the center of the gap top plate 52 (refer to FIG. 6), flows into a gap-shaped flow path formed by the inner surface 41b of the heat transmission plate 41 and the surface of the gap top plate 52 on the heat transmission plate 41 side thereof, the inner surface 41b facing the surface of the gap top plate 52 described above via the opening 53a of the gap interval plate 53 (refer to FIG. 7). Then, the water passes through the gap-shaped flow path and extends from the center of the gap-shaped flow path to the peripheral edge thereof, flows into the collection groove 46 passing through the slits 52b of the gap top plate 52 (refer to FIG. 6) from the opening 53a of the gap interval plate 53 (refer to FIG. 7), and is discharged to the outside passing through a discharge port 47.

In the cooling plate 50 shown in FIG. 5, since the gap forming plate 54, which is composed of the two thin plate members of the gap top plate 52 and the gap interval plate 53, is pressed by the annular elastic member 51, the intimate contact property of the thin plate members with the heat transmission plate 41 can be enhanced. With the above arrangement, the interval of the gap-shaped flow path can be accurately formed without extremely increasing the degree of flatness of the respective members. Accordingly, it is possible to make the semiconductor device cooling apparatus at a low cost by greatly easing the tolerances of the shapes of the respective members.

Note that the shapes of the gap top plate 52 and the gap interval plate 53 explained above are only examples, the divided number and the shape of the slits 52b, and the number and the shape of the projections 53b can be arbitrarily selected within a range in which the flow of the water from the supply port 43 to the discharge port 47 is not blocked.

The gap forming plate 54 is composed of the two thin plate members of the gap top plate 52 and the gap interval plate 53 here. In this case, the thicknesses of the respective plates can be formed uniformly, respectively, which is preferable in production. However, it is not always necessary to form the gap forming plate 54 of the two thin plate members of the gap top plate 52 and the gap interval plate 53, and the gap forming plate 54 may be formed of a single plate member. In this case, the gap forming plate 54 can be produced in large quantities by half etching of a metal plate, molding of a resin, and the like.

Figure 8:
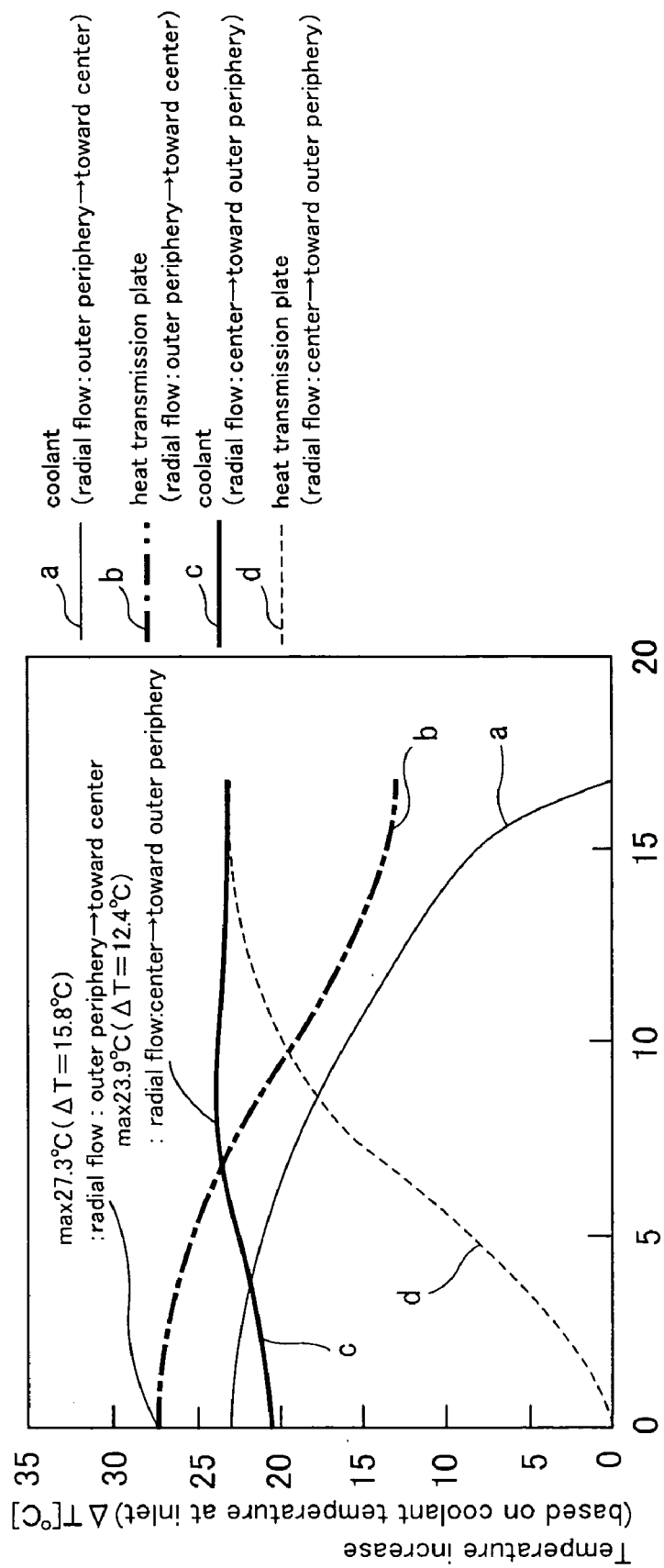
FIG. 8 is a view showing a result of simulation of the cooling capability of the cooling plate (embodiment) shown in FIG. 3 and the cooling capability of a comparative example.

FIG. 8 is a view showing a result of simulation of the cooling capability of the cooling plate shown in FIG. 3 (embodiment) and the cooling capability of a comparative example.

In FIG. 8, a horizontal axis shows the radius (mm) of a cooling plate from a center, and a longitudinal axis shows temperature increases ΔT [° C.] of a heat transmission plate and a coolant when the temperature of the coolant at an inlet is used as a reference.

In FIG. 8, graphs a and b show the temperature increases of the coolant (water) and the heat transmission plate in the cooling plate 40 shown in FIGS. 3 and 4 at respective distances from the center (supply port 43) when the coolant (water) is supplied from the discharge port 47 and discharged from the supply port 43.

As can be found from the graphs a and b, when the coolant (water) is flown from the peripheral edge of the heat transmission plate and collected at the center thereof, the temperature increase of the heat transmission plate is greatly different between the peripheral edge and the center thereof.

Further, graphs c and d in FIG. 8 show the temperature increases of the coolant (water) and the heat transmission plate when the coolant (water) is supplied from the supply port 43 at the center of the cooling plate having the structure shown in FIGS. 3 and 4 and discharged from the discharge port 47 at the peripheral edge thereof.

As can be found particularly from the graph c, the cooling plate exhibits an approximately uniform cooling property without a significant difference in temperature increase between the center and the peripheral edge of the cooling plate.

When the maximum temperature increases of the heat transmission plates are compared with each other, the cooling capability of the embodiment (graph c) is improved 27% as compared with the comparative example (graph b) in which the same amount of coolant (water) is flown from the outer periphery to the center while the same structure of the cooling plate shown in FIGS. 3 and 4 is employed.

Further, simulation of the cooling plate (refer to JP-A 10-246531) was also executed, the cooling plate being arranged such that water was uniformly flown in a thin laminar thickness as a parallel flow from one side to the other side with the other conditions such as the size of the cooling plate, the interval of the gap-shaped flow path, and the like set similar to those of the cooling plate shown in FIGS. 3 and 4. Although illustration is omitted, according to a result of the simulation, a temperature increase was greatly different in a center and a periphery similar to the case of the graph b, and further a temperature greatly increased in its entirety. This means that it was difficult for the heat transmitted from a semiconductor device to be absorbed by a coolant (water).

When the embodiment (graph d) was compared with the result of simulation of the cooling plate employing the parallel water flow, it was found that the cooling capability of the embodiment was improved 55%.

Note that although it is explained that water is used as the coolant in the above explanation, the coolant is by no means limited to water, and any liquids such as a fluorocarbon liquid and the like can be used as the coolant as long as it can be used for cooling.

What is claimed is:

1. A semiconductor device cooling apparatus including a heat transmission plate that receives heat from a semiconductor device at approximately the center of an outer surface and forms a coolant flow path in contact with the inner surface of the heat transmission plate opposite to the outer surface thereof facing the semiconductor device, further comprising:
   a coolant supply port that supplies a coolant to the central portion of the inner surface of the heat transmission plate;
   a gap-shaped flow path sandwiched between the inner surface of the heat transmission plate and a surface that extends in parallel with the inner surface, the gap-shaped flow path radially flowing out the coolant supplied to the central portion of the inner surface of the heat transmission plate from the central portion toward the peripheral edge portion of the inner surface of the heat transmission plate;
   a coolant collection groove which is formed around the peripheral edge portion and whose height from the inner surface of the heat transmission plate is larger than the height of the gap-shaped flow path to collect the coolant flowing out from the gap-shaped flow path;
   a coolant discharge port that discharges the coolant collected in the coolant collection groove therefrom,
   a gap forming plate disposed partly in contact with the inner surface of the heat transmission plate to form the gap-shaped flow oath between the surface extending in parallel with the inner surface and the inner surface;
   an elastic member which presses the gap forming plate against the inner surface of the heat transmission plate as well as whose side acts as a side wall which partitions the coolant collection groove; and
   a housing that keeps the elastic member in the state that the elastic member presses the gap forming plate as well as partitions the coolant collection groove in cooperation with the outer peripheral portion of the inner surface of the heat transmission plate and a side of the elastic member.

2. A semiconductor device cooling apparatus according to claim 1, wherein the gap forming plate comprises:
   a gap top plate which has a surface expanding in parallel with the inner surface of the heat transmission plate and forms the gap-shaped flow path in cooperation with the inner surface of the heat transmission plate; and
   a gap interval plate which is interposed between the gap top plate and the inner surface of the heat transmission plate and keeps the gap top plate at a height position where the gap-shaped flow path is formed.

* * * * *